US006809541B2

(12) United States Patent
Bu et al.

(10) Patent No.: US 6,809,541 B2
(45) Date of Patent: Oct. 26, 2004

(54) TESTING APPARATUS EMBEDDED IN SCRIBE LINE AND A METHOD THEREOF

(75) Inventors: Lin-Kai Bu, Tainan (TW); Kun-Cheng Hung, Hsinchu (TW)

(73) Assignee: Himax Technologies, Inc., Tainan (TW)

( * ) Notice: Subject to any disclaimer, the term of this patent is extended or adjusted under 35 U.S.C. 154(b) by 3 days.

(21) Appl. No.: 10/151,028

(22) Filed: May 21, 2002

(65) Prior Publication Data

US 2002/0175696 A1 Nov. 28, 2002

(30) Foreign Application Priority Data

May 22, 2001 (TW) .......................................... 90112307 A

(51) Int. Cl.[7] .............................................. G01R 31/26
(52) U.S. Cl. ...................................................... 324/765
(58) Field of Search ................................ 324/765, 763, 324/158.1, 73.1; 714/733; 327/236, 244, 2; 257/48

(56) References Cited

U.S. PATENT DOCUMENTS

| 4,956,602 | A | * | 9/1990 | Parrish | ........................ 324/537 |
|---|---|---|---|---|---|
| 4,961,053 | A | * | 10/1990 | Krug | ........................ 324/537 |
| 5,446,395 | A | * | 8/1995 | Goto | ........................ 324/763 |
| 6,133,582 | A | * | 10/2000 | Osann et al. | ................. 257/48 |
| 6,275,085 | B1 | * | 8/2001 | Mullarkey | .................. 327/276 |

* cited by examiner

*Primary Examiner*—David A. Zarneke
*Assistant Examiner*—Tung X. Nguyen
(74) *Attorney, Agent, or Firm*—Rabin & Berdo, P.C.

(57) ABSTRACT

A testing method and a testing a voltages apparatus embedded in the scribe line on a wafer are disclosed, for testing the to be measured from a die on a wafer. The testing apparatus includes a multiplexer and a comparator. The multiplexer receives the voltages to be measured and outputs a multiplexing or selected voltage according to a selection signal. The comparator receives a reference voltage and the multiplexing voltage and then outputs a digital result by comparing the reference voltage, and the multiplexing voltage. The digital result can be applied to a digital testing machine, such that testing speed is increased and testing cost is decreased. Moreover, the testing apparatus embedded in the scribe lines has the capability to compensate for the comparator's offset, and accordingly, the testing reliability is also improved.

7 Claims, 3 Drawing Sheets

TESTING APPARATUS EMBEDDED IN SCRIBE LINE AND A METHOD THEREOF

This application incorporates by reference Taiwanese application Serial No. 90112307, filed May 22, 2001.

BACKGROUND OF THE INVENTION

1. Field of the Invention

The present invention relates to a testing method and a testing apparatus, particularly, to a testing apparatus embedded in a scribe line and applicable to a digital testing machine.

2. Description of the Related Art

The manufacturing of integrated circuits (ICs) on a wafer comprises steps of deposition, diffusion, patterning, etching and so forth. FIG. 1 shows a wafer 100 after the semiconductor manufacturing process is accomplished thereon. The dies 102 are separated by scribe lines 104, which are areas for dicing the wafer. Firstly, the wafer 100 needs to be processed with a chip-probing (CP) test, which can filter out the failed dies 102 produced in the manufacturing of the semiconductor. Then, the wafer 100 is diced along the scribe lines 104 and thus many small dies 102 are created. Finally, dies 102 are packaged and processed with a final test to filter out the failed dies 102 produced in the packaging.

For illustration, a data driving IC of a liquid crystal display (LCD) die is taken as the example. Each data driving IC consists of a plurality of outputs, and each output represents an analog gray-scale value of up to 64 or up to 256. The chip-probing (CP) test of a data driving IC is processed by an analog testing machine to check the precision of the outputs from the data driving ICs. The performance of the analog testing machine generally satisfies the user's requirements.

However, the speed of testing usually does not satisfy the requirement of user. For instance, each analog testing machine comprises 2, 4, 6, or 8 channels, which means that the data driving IC's outputs with the numbers of 2, 4, 6, or 8 can be tested at the same time. Usually, each data driving IC comprises 384 outputs; each output represents a gray-scale value of up to 64; each gray-scale value consists of positive and negative polarities; thus, the number of samples needed to be tested for each data driving IC is 384*64*2= 49,152. Accordingly, the test time takes about 1 sec. If each output represents a the gray-scale value of up to 256, the test time will be about 10 seconds, with the number of samples being 196,608. Although a data driving IC with more outputs produces a higher quality display, it also rapidly increases the cost of testing due to the high cost of the testing facility.

SUMMARY OF THE INVENTION

The object of the present invention therefore is to provide a testing apparatus embedded in a scribe line and a testing method thereof, which can increase the testing speed and decrease the testing cost.

The testing apparatus is used to check the level of precision of (n−1) voltages to be measured and comprises a multiplexer and a comparator. The multiplexer comprises n inputs for receiving the (n−1) voltages to be measured or a calibration voltage and comprises one output for outputting a multiplexing voltage according to a selection signal, wherein the multiplexing voltage is one of the (n−1) voltages to be measured and the calibration voltage. The comparator receives a reference voltage and the multiplexing voltage and then outputs a digital result by comparing the reference voltage and the multiplexing voltage.

The testing method applied in the testing apparatus is also disclosed in the present invention. Firstly, the comparators are grouped into m types, wherein the different types correspond to the different offset voltages of the comparators. Then, the voltages to be measured and a comparison voltage are applied to comparators of the kth type, wherein the comparison voltage is the reference voltage plus the offset voltage. Finally, precision levels of the voltages to be measured are checked according to the digital signals outputted from the comparators.

BRIEF DESCRIPTION OF THE DRAWINGS

The above objects and other advantages of the present invention will become more apparent from a detailed description of the preferred embodiments of the present invention, with reference to the attached drawings in which.

DESCRIPTION OF THE PREFERRED EMBODIMENTS

Figure 1:
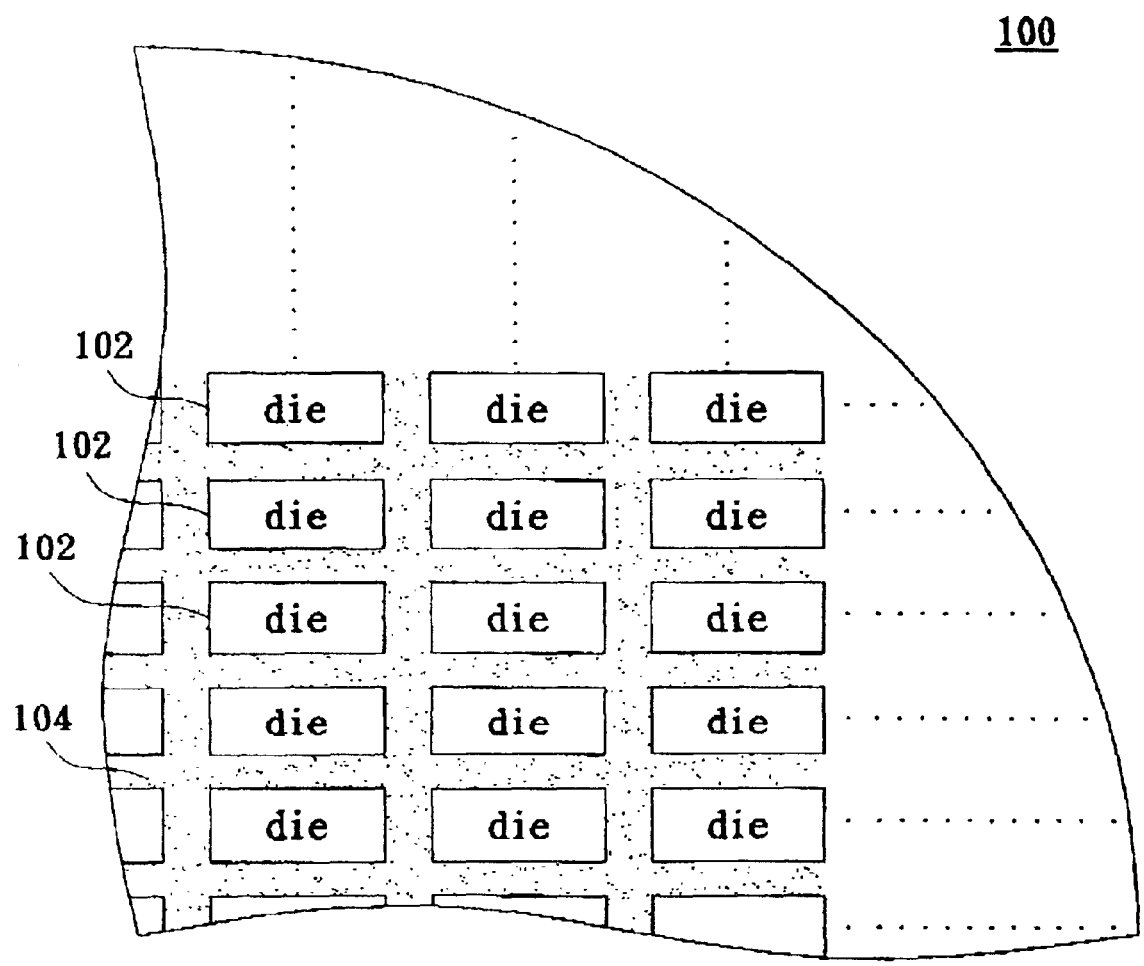
FIG. 1 shows a wafer in accordance with the prior art after the semiconductor manufacturing process is accomplished thereon.
Figure 2:
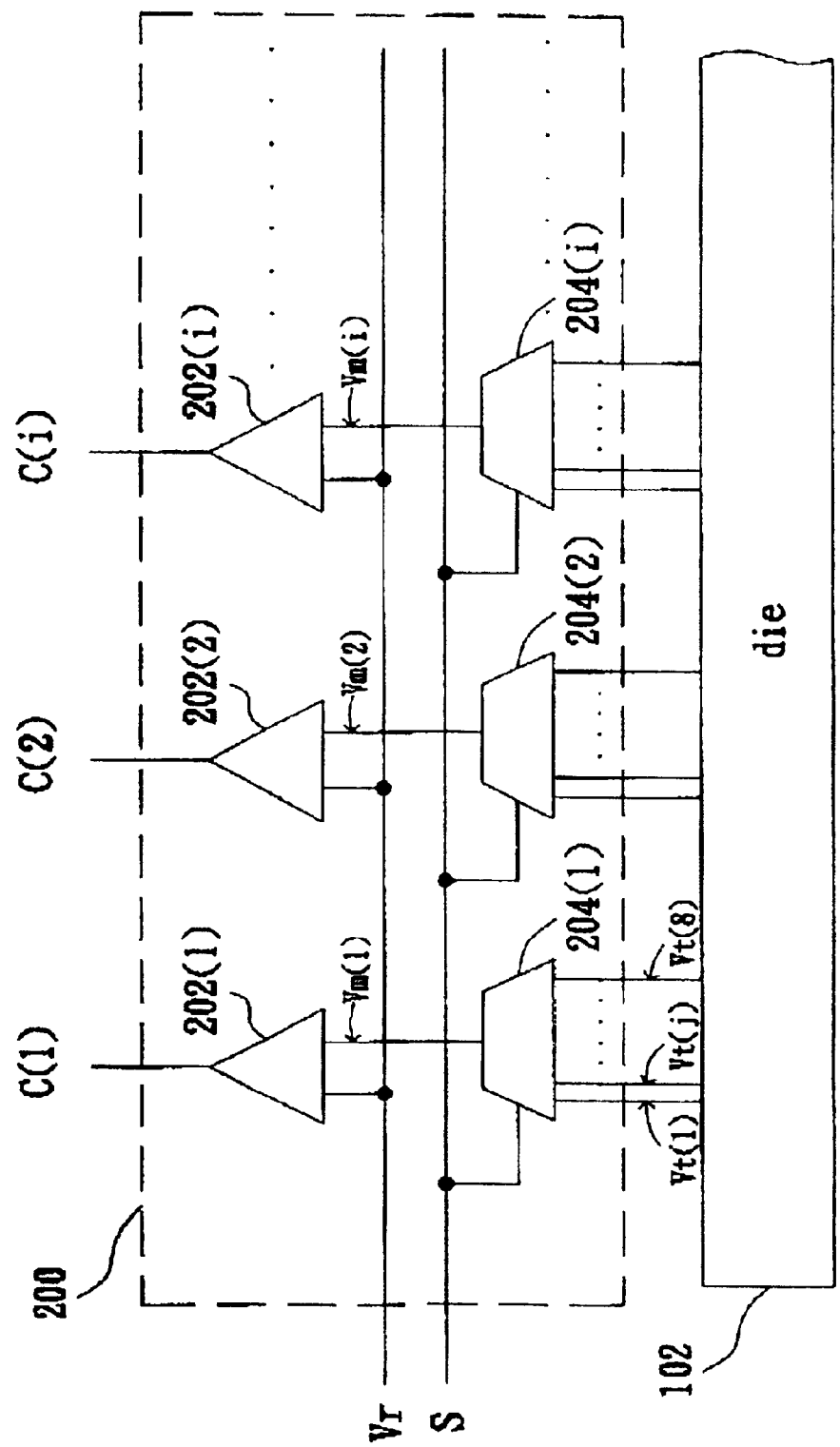
FIG. 2 shows a testing circuit embedded in a scribe line on a wafer according to a preferred embodiment of the present invention.

Referring to FIG. 2, it shows a testing circuit embedded in a scribe line on a wafer according to a preferred embodiment of the present invention. The testing circuit 200 receives a plurality of voltages Vt(j) to be measured, which are outputted from the circuits of a die 102 and need to be tested for their precision, and the testing circuit 200 also outputs a plurality of digital signals C(i). The digital signals C(i) are inputted into a digital testing machine to test the precision level of voltages Vt(j) to be measured. The testing circuit 200 comprises a plurality of comparators 202 and a plurality of multiplexers 204, wherein each comparator 202 corresponds to a multiplexer 204. Each multiplexer 204(i) consists of n inputs for receiving n voltages Vt(j) to be measured and one output for outputting a selected or multiplexing voltage Vm(i) according to the amplitude of selection signal S, wherein Vm(i) is one of the voltages Vt(j) to be measured. The comparator 202(i) receives the multiplexing Vm(i) and the reference voltage Vr, and outputs the digital signal C(i) after comparing the multiplexing voltages Vm(i) and the reference voltage Vr.

If the comparator 202(i) has an offset, the testing result of the comparator 202(i) will be not correct. For example, a multiplexing voltage of 5.003V will be regarded as the same level as the reference voltage of 5V. Therefore, a testing circuit capable of compensating for an offset of the comparator 202(i) is disclosed as follow.

Figure 3:
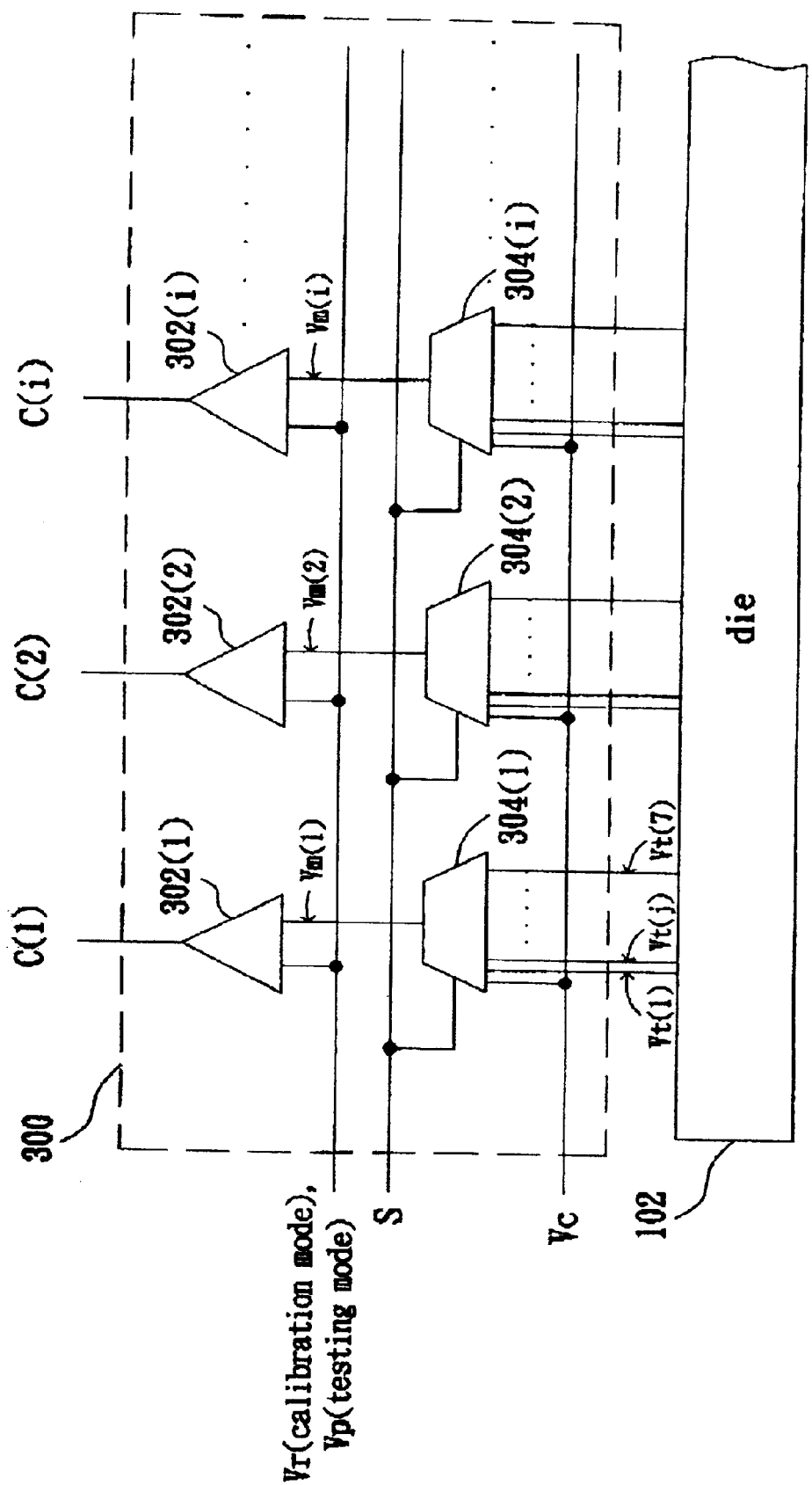
FIG. 3 shows a testing circuit embedded in a scribe line according to another preferred embodiment of the present invention.

FIG. 3 shows a testing circuit 300 embedded in a scribe line according to another preferred embodiment of the present invention. The testing circuit 300 comprises several comparators 302(i) and several multiplexers 304(i), wherein one comparator 302(i) corresponds to one multiplexer 304(i). A multiplexer 304(i) comprises n inputs for receiving a calibration voltage Vc and (n−1) voltages Vt(j) to be measured, and further comprises one output for outputting a multiplexing voltage Vm(i) according the selection signal S, wherein the multiplexing voltage Vm(i) is the calibration voltage Vc or one of the (n−1) voltages Vt(j) to be measured.

The testing circuit 300 performs either in a calibration mode or a testing mode. In the calibration mode, the multiplexer 304(i) outputs the calibration voltage Vc as the selected or multiplexing voltage Vm(i), and the comparator 302(i) receives the multiplexing voltage Vm(i) and a reference voltage Vr. In the testing mode, the multiplexer 304(i) outputs one of voltages the Vt(j) to be measured as the multiplexing voltage Vm(i), and the two inputs applied to the comparator 302(i) are the multiplexing voltage Vm(i) and a comparison voltage Vp.

At first, the testing circuit 300 functions in the calibration mode, and the multiplexer 304(i) outputs the calibration voltage Vc to measure the offset of the corresponding comparator 302(i). By increasing the calibration voltage Vc progressively, all comparators 302(i) are grouped into m types according their offset, wherein the method thereof will be described in the next two paragraphs. Here, we suppose that the offsets of all comparators 302(i) are located in the range from −10 mV to 10 mV and they are grouped into m=10 types. For example, the comparators 302(i) of m=1 type have a offset in the range from −10 mV to −8 mV, the comparators 302(i) of m=2 type have a offset in the range from −8 mV to −6 mV, and so on.

Then, the testing circuit 300 changes its status from calibration mode to testing mode. By selecting the number of m types, the comparators 302(i) of the specified m type receive one of the voltages Vt(j) to be measured outputted from the multiplexer 304(i) and the comparison voltage Vp, which is the sum of the compensation voltage Verr and the reference voltage Vr. In this example, the compensation voltage Verr corresponding to comparators 302(i) of m=1 type is −8 mV, and the compensation voltage Verr corresponding to comparators 302(i) of m=2 type is −6 mV, and so forth.

After comparing one of the voltages Vt(j) to be measured and the comparison voltage Vp, the comparator 302(i) outputs a digital signal C(i), which indexes the precision level of the voltage Vt(j) to be measured. Next, other voltages Vt(j) to be measured are also inputted to comparator 302(i) by sequence for the specified group of comparators 302(i). Furthermore, other groups of comparators 302(i) are selected in turn and all voltages Vt(j) to be measured corresponding to all comparators 302(i) are tested without the effect of the offset.

Now, the grouping method of the comparators 302(i) is described as follow. The first step is to define parameters of the upper-limit error ΔV+, the lower-limit error ΔV−, the upper-limit voltage V+, the lower limit voltage V− and a district voltage ΔV. The upper-limit error ΔV+ and the lower-limit ΔV− error are determined by the tolerance of all comparators 302(i). The upper-limit voltage V+ is defined by the sum of the reference voltage Vr and the upper-limit error ΔV+, and the lower-limit voltage V− is defined by the sum of the reference voltage Vr and the lower-limit error ΔV. Moreover, the district voltage ΔV is (ΔV+−ΔV−)/m, wherein m is the number of groups of all comparators 302(i).

The second step is to filter out abnormal comparators 302(i). The lower-limit voltage V− and reference voltage Vr are inputted to the first input and second input of a comparator 302(i) respectively. The comparator 302(i) outputs a digital signal C(i) of the first level, which means the voltage received by the first input is smaller than that of the second input. If the upper-limit voltage V+ replaces the lower-limit voltage V−, the comparator 302(i) will output a digital signal C(i) of the second level. For signals that do not obey the rules described above, the corresponding comparators 302(i) do not continue to the following steps. In addition, these operating principles are also applied in the testing mode to check the precision level of the voltages Vt(j) to be measured.

In the third step, all comparators 302(i) are grouped into different types by respectively applying an increasing calibration voltage Vc and a reference voltage Vr to the first input and the second input therein. The calibration voltage Vc is (V−+ΔV*k), wherein k is 1≦k≦m. As k increases from 1 to m, the calibration voltage Vc also increases gradually. At first, the digital signal C(i) outputted from the comparator 302(i) is in the first level. The corresponding comparator 302(i) belongs to kth type, so that a value of (k−1) corresponds to a digital signal C(i) in the first level and a value of k changes the digital signal C(i) to the second level. As k increases to a value of m, the comparators 302(i) that are not grouped belong to the mth type.

Therefore, by the three-step method, all comparators 302(i) can be grouped into different types according to their offsets. For the case described above, the parameters of the upper-limit error ΔV+, the lower-limit error ΔV− and the district voltage ΔV are selected as 10 mV, −10 mV and 2 mV, wherein m=10 types. Please note that the grouping process of the present invention does not limit to the increasing method of k, and that a decreasing method of k is also within the scope of the present invention.

In the present invention, the voltages Vt(j) to be measured and the comparison voltage Vp are compared by the comparator 302(i). The result of digital signal C(i) outputted from the comparator 302(i) can be applied to a digital testing machine. Generally, a digital testing machine not only costs less than an analog testing machine, but also comprises more channels than an analog testing machine, wherein there are at least 60 channels in a digital testing machine and only about 8 channels in an analog testing machine. In addition, the testing frequency of a digital testing machine is greater than 60 MHz and thus can process about 6,000,000 times per second, while an analog testing machine can process only about 50,000 times per second.

Therefore, the testing speed is increased and the testing cost is decreased greatly according to the modification in the present invention. Moreover, the testing circuit is embedded in the scribe line on the wafer and other additional manufacturing steps are not needed. Furthermore, the testing circuit embedded in the scribe lines has the capability to compensate for the comparator's offset, such that testing reliability is also improved.

Once given the above disclosure, many other features, modifications, and improvements will become apparent to the skilled artisan. Such other features, modifications, and improvements are considered to be a part of this invention, and therefore the scope of the following claims should be accorded the broadest interpretation.

What is claimed is:

1. A testing apparatus embedded in a scribe line on a wafer, said wafer comprising a die, said testing apparatus used to test the amplitudes of a plurality of voltages to be measured, said voltages to be measured being outputted from said die, said testing apparatus comprising:

a comparator, said comparator receiving a reference voltage and one of said voltages to be measured and outputting a result by comparing said reference voltage and one of said voltages to be measured.

2. A testing apparatus embedded in a scribe line on a wafer, said wafer comprising a die, said testing apparatus being used to test the amplitudes of n voltages to be measured, said n voltages to be measured being outputted from said die, n being an integral larger than one, said testing apparatus comprising:

a multiplexer comprising n inputs and one output, said n inputs receiving said n voltages to be measured and said output being used to output a selected voltage that is selected from among said n voltages to be measured according to a selection signal; and a comparator, said comparator receiving a reference voltage and said selected voltage and then outputting a result by comparing said reference voltage and said selected voltage.

3. The testing apparatus of claim 2, wherein said n equals 8.

4. A testing apparatus embedded in a scribe line on a wafer, said wafer comprising a die, said testing apparatus being used to test (n−1) voltages to be measured, said (n−1) voltages to be measured being outputted from said die, n being an integral larger than unit, said testing apparatus comprising:

a multiplexer comprising n inputs and one output, said n inputs receiving said (n−1) voltages to be measured and a calibration voltage, said output being used to output a selected voltage according to a selection signal, said selected voltage being one of said (n−1) voltages to be measured or said calibration voltage; and a comparator, said comparator receiving a reference voltage and said selected voltage and then outputting a result by comparing said reference voltage and said selected voltage.

5. The testing apparatus of claim 4, wherein n equals 8.

6. The testing apparatus of claim 4, wherein said multiplexer outputs said calibration voltage to measure an offset of said comparator as said testing apparatus functions in a calibration mode, and said multiplexer outputs one of said (n−1) voltages to be measured to test the amplitudes of said (n−1) voltages to be measured as said testing apparatus functions in a testing mode.

7. The testing apparatus of claim 6, wherein, when said testing apparatus functions in the testing mode, said reference voltage is adjusted according to said offset.

* * * * *